United States Patent
An et al.

(10) Patent No.: US 11,545,340 B2
(45) Date of Patent: Jan. 3, 2023

(54) APPARATUS FOR MONITORING PULSED HIGH-FREQUENCY POWER AND SUBSTRATE PROCESSING APPARATUS INCLUDING THE SAME

(71) Applicant: SEMES CO., LTD., Cheonan-si (KR)

(72) Inventors: Jong Hwan An, Yongin-si (KR);
Shin-Woo Nam, Yongin-si (KR); Hong Won Lee, Yongin-si (KR); Jae Bak Shim, Seoul (KR)

(73) Assignee: SEMES CO., LTD., Cheonan-si (KR)

(*) Notice: Subject to any disclaimer, the term of this patent is extended or adjusted under 35 U.S.C. 154(b) by 108 days.

(21) Appl. No.: 17/089,041

(22) Filed: Nov. 4, 2020

(65) Prior Publication Data

US 2021/0050184 A1 Feb. 18, 2021

Related U.S. Application Data

(63) Continuation of application No. 15/291,193, filed on Oct. 12, 2016, now abandoned.

(51) Int. Cl.
*H01J 37/32* (2006.01)
*G01R 23/04* (2006.01)
(Continued)

(52) U.S. Cl.
CPC ........ *H01J 37/32146* (2013.01); *G01R 23/04* (2013.01); *G01R 23/10* (2013.01); *G01R 29/02* (2013.01); *H01J 37/32174* (2013.01); *H01J 37/32935* (2013.01); *H02M 7/04* (2013.01); *H03H 7/24* (2013.01); *H03H 7/38* (2013.01);
(Continued)

(58) Field of Classification Search
CPC .......... H01J 37/32146; H01J 37/32935; H01J 2237/334; H01J 37/32174; H02M 7/04; H03H 7/38; H03H 7/24; G01R 23/10; G01R 29/02
See application file for complete search history.

(56) References Cited

U.S. PATENT DOCUMENTS 5,436,580 A 7/1995 Kellmann et al.
5,973,637 A 10/1999 Perdue et al.
(Continued)

FOREIGN PATENT DOCUMENTS

JP 2012-098156 A 5/2012
KR 10-0317915 B1 12/2001
(Continued)

OTHER PUBLICATIONS

Non-Final Office Action dated Mar. 25, 2019 in U.S. Appl. No. 15/291,193.
(Continued)

*Primary Examiner* — Yuechuan Yu
(74) *Attorney, Agent, or Firm* — Harness, Dickey & Pierce, P.L.C.

(57) ABSTRACT

Disclosed are an apparatus for monitoring pulsed high-frequency power and a substrate processing apparatus including the same. The apparatus includes an attenuation module configured to attenuate a pulsed high-frequency power signal; a rectifier module configured to convert the pulsed high-frequency power signal into a direct current signal; and a detection module configured to detect a pulse parameter based on the direct current signal.

20 Claims, 6 Drawing Sheets

(51) Int. Cl.
    *G01R 23/10*     (2006.01)
    *G01R 29/02*     (2006.01)
    *H02M 7/04*     (2006.01)
    *H03H 7/24*     (2006.01)
    *H03H 7/38*     (2006.01)
    *G01R 21/12*     (2006.01)

(52) U.S. Cl.
    CPC ......... *G01R 21/12* (2013.01); *H01J 2237/334* (2013.01)

(56) References Cited

U.S. PATENT DOCUMENTS

| | | | |
|---|---|---|---|
| 7,495,456 B2 | 2/2009 | Horii et al. | |
| 2010/0023289 A1 | 1/2010 | Miyazaki et al. | |
| 2010/0248488 A1* | 9/2010 | Agarwal | H01J 37/32706 438/714 |
| 2012/0052689 A1* | 3/2012 | Tokashiki | H01L 21/31116 156/345.28 |
| 2012/0098575 A1* | 4/2012 | Boston | H03H 7/40 327/104 |

FOREIGN PATENT DOCUMENTS

| | | |
|---|---|---|
| KR | 10-0833646 B1 | 5/2008 |
| KR | 2008-0078053 A | 8/2008 |
| KR | 2013-0097106 A | 9/2013 |
| KR | 2014-0109267 A | 9/2014 |
| KR | 2015-0017705 A | 2/2015 |
| KR | 2015-0072785 A | 6/2015 |

OTHER PUBLICATIONS

Non-Final Office Action dated Aug. 6, 2019 in U.S. Appl. No. 15/291,193.
Final Office Action dated Nov. 25, 2019 in U.S. Appl. No. 15/291,193.
Non-Final Office Action dated Mar. 16, 2020 in U.S. Appl. No. 15/291,193.
Notice of Allowance dated Aug. 10, 2020 in U.S. Appl. No. 15/291,193.

* cited by examiner

APPARATUS FOR MONITORING PULSED HIGH-FREQUENCY POWER AND SUBSTRATE PROCESSING APPARATUS INCLUDING THE SAME

CROSS-REFERENCE TO RELATED APPLICATIONS

This application is a Continuation of U.S. application Ser. No. 15/291,193, filed on Oct. 12, 2016, which claims priority under 35 U.S.C. § 119 to Korean Patent Application No. 10-2015-0142288 filed Oct. 12, 2015, in the Korean Intellectual Property Office, the entire contents of each of which are hereby incorporated by reference.

BACKGROUND

Embodiments of the inventive concept described herein relate to an apparatus for monitoring pulsed high-frequency power and a substrate processing apparatus including the same.

Devices such as component transistors are formed on a semiconductor wafer made of silicon in semiconductor integrated circuit (IC) manufacture. In such a manufacturing process, various material layers are deposited to form or construct an IC circuit, where the various material layers are connected to each other through metallization lines.

However, in a semiconductor etching process using plasma, since many charges are non-uniformly accumulated on the surface of a wafer, destructive current may be generated on a part of a metal line material or arcing may be caused in dielectric layers.

Such destructive current or arcing destroys or damages specific devices previously formed on a wafer and in addition, causes a processing chamber to be electrically damaged, so that a serious loss may be caused. However, when the high-frequency power supplied to the plasma in a plasma chamber is pulsed (by repeatedly applying ON/OFF pulses for a specific time) to neutralize the charges accumulated on the wafer surface for an OFF time, the damages may be prevented.

SUMMARY

Embodiments of the inventive concept provide an apparatus and a method for monitoring pulsed high-frequency power which can easily monitor the pulsed high-frequency (RF) power in real time.

Technical tasks obtainable from the inventive concept are non-limited the above-mentioned technical task. And, other unmentioned technical tasks may be clearly understood from the following description by those having ordinary skill in the technical field to which the inventive concept pertains.

According to one aspect of an embodiment, an apparatus for monitoring pulsed high-frequency power includes a rectifier module configured to convert a pulsed high-frequency power signal into a direct current signal; and a detection module configured to detect a pulse parameter based on the direct current signal.

The apparatus may further include an attenuation module configured to attenuate the pulsed high-frequency power signal, wherein the rectifier module converts a high-frequency power signal attenuated by the attenuation module into a direct current signal.

The pulse parameter may include at least one of a pulse frequency, a pulse duty ratio and a pulse phase of the direct current signal.

The detection module may include a differentiator configured to differentiate the direct current signal; and an edge detection unit configured to detect an edge of the direct current signal based on a differentiation value obtained by differentiating the direct current signal through the differentiator.

The edge detection unit may include a rising edge detection unit configured to detect a rising edge of the direct current signal; and a falling edge detection unit configured to detect a falling edge of the direct current signal.

The detection module may further include a pulse frequency calculation unit configured to calculate a pulse frequency of the direct current signal based on at least two continuous rising edge signals detected by the rising edge detection unit.

The detection module may further include a pulse duty ratio calculation unit configured to calculate a pulse duty ratio of the direct current signal based on the rising and falling edge signals sequentially detected by the rising and falling edge detection units.

The apparatus detection module may further include a pulse phase calculation unit configured to calculate a phase by comparing edge signals detected by the edge detection unit with one another when a plurality of direct current signals are applied to the detection module.

The attenuation module may attenuate the pulsed high-frequency power signal such that the pulsed high-frequency power signal is in a range of 0 V to 10 V.

According to another aspect of an embodiment, an apparatus for processing a substrate includes a high-frequency power source configured to provide at least one high-frequency power; a pulse input unit configured to apply an ON/OFF pulse to the high-frequency power source to pulse the high-frequency power; a chamber comprising a plasma source configured to generate plasma by using the pulsed high-frequency power; an impedance matching unit connected between the high-frequency power source and the chamber to perform impedance matching; an attenuation module disposed on an outside of the chamber to attenuate a pulsed high-frequency power signal which is applied to the chamber; a rectifier module configured to convert a high-frequency power signal attenuated by the attenuation module into a direct current signal; and a detection module configured to detect a pulse parameter based on the direct current signal.

The pulse parameter may include at least one of a pulse frequency, a pulse duty ratio and a pulse phase of the direct current signal.

The attenuation module may be disposed between the chamber and the impedance matching unit or between the high-frequency power source and the impedance matching unit.

The detection module may include a differentiator configured to differentiate the direct current signal; and an edge detection unit configured to detect an edge of the direct current signal based on a differentiation value obtained by differentiating the direct current signal through the differentiator.

The edge detection unit may include a rising edge detection unit configured to detect a rising edge of the direct current signal; and a falling edge detection unit configured to detect a falling edge of the direct current signal.

According to still another aspect of an embodiment, a method of monitoring pulsed high-frequency power includes differentiating a direct current signal of the pulsed high-frequency power; detecting an edge signal of the direct current signal of the pulsed high-frequency power based on a differentiation value of the differentiated direct current signal; and calculating a pulse parameter of the direct current of the pulsed high-frequency power based on the detected edge signal.

The detecting of the edge signal may include detecting a rising edge signal of the direct current signal of the pulsed high-frequency power; and detecting a falling edge signal of the direct current signal of the pulsed high-frequency power.

The calculating of the pulse parameter may include calculating a pulse frequency of the direct current signal based on at least two continuous rising edge signals of the rising edge signals.

The calculating of the pulse parameter may include calculating a pulse duty ratio of the direct current signal based on the rising and falling edge signals sequentially detected.

The calculating of the pulse parameter may include, when the direct current signal of the pulsed high-frequency power includes a plurality of direct current signals, calculating a pulse phase by comparing edge signals of the current signals with one another.

According to still another aspect of an embodiment, a computer-readable recording medium may record a program to implement a method of monitoring pulsed high-frequency power.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Advantages and features of embodiments of the inventive concept, and method for achieving thereof will be apparent with reference to the accompanying drawings and detailed description that follows. But, it should be understood that the inventive concept is limited to the following embodiments and may be embodied in different ways, and that the embodiments are given to provide complete disclosure of the inventive concept and to provide thorough understanding of the inventive concept to those skilled in the art, and the scope of the inventive concept is limited only by the accompanying claims and equivalents thereof.

Even though it is not defined, all terms (including technical or scientific terms) used herein have the same meanings as those belonging to the inventive concept is generally accepted by common techniques in the art. The terms defined in general dictionaries may be construed as having the same meanings as those used in the related art and/or a text of the present application and even when some terms are not clearly defined, they should not be construed as being conceptual or excessively formal. The terms used in the present specification are provided to describe embodiments, not intended to limit it.

The terms of a singular form may include plural forms unless referred to the contrary. The meaning of "comprises" and/or "comprising" specifies a property, a region, a fixed number, a step, a process, an element and/or a component but does not exclude other properties, regions, fixed numbers, steps, processes, elements and/or components. In addition, the terms "provided", "having" and the like may be interpreted like the above.

Embodiments relate to an apparatus for monitoring pulsed high-frequency power and a substrate processing apparatus including the same, and provide an apparatus and a method which can easily monitor pulsed high-frequency power in real time. An apparatus for monitoring high-frequency power according to an embodiment may rectify a pulsed high-frequency power signal applied from a high-frequency power source to generate a direct current signal, and detect a pulse parameter, such as a pulse frequency, a pulse duty ratio or a pulse phase, based on the direct current signal, such that the apparatus monitors the pulsed high-frequency power signal. In addition, the high-frequency power signal, which is converted into the direct current signal, may be an attenuated high-frequency power signal in a predetermined range.

Figure 1:
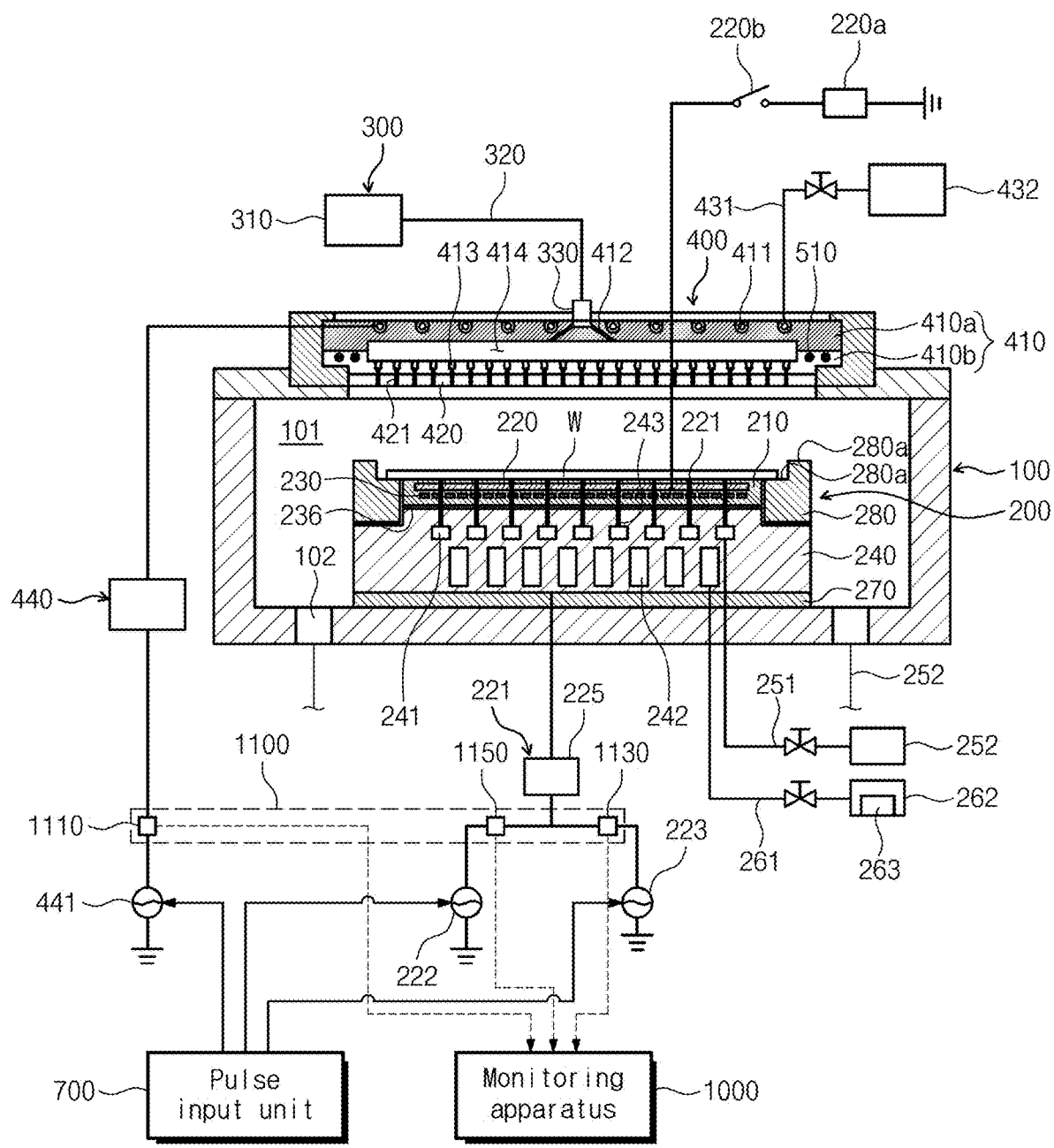
FIG. 1 is a view illustrating a substrate processing apparatus including an apparatus for monitoring pulsed high-frequency power according to an embodiment.

FIG. 1 is a view illustrating a substrate processing apparatus including an apparatus for monitoring pulsed high-frequency power according to an embodiment.

FIG. 1 shows a substrate processing apparatus of a capacitively coupled plasma (CCP) type, but the embodiment is not limited thereto. The embodiment may be applied to a substrate processing apparatus of an inductively coupled plasma (ICP) type.

Referring to FIG. 1, the substrate processing apparatus 10 processes a substrate W by using plasma. For example, the substrate processing apparatus 10 may perform a process of etching the substrate W. The substrate processing apparatus 10 may include a chamber 100, a substrate support assembly 200, a gas supply unit 300, a plasma generation unit 400, an attenuation module 1100, a pulse input unit 700 and an apparatus 1000 for monitoring pulsed high-frequency power.

The chamber 100 has a space 101 therein. The inner space 101 serves as a space in which performs a process of treating the substrate W with plasma. An exhaust hole 102 is formed on a bottom surface of the chamber 100. The exhaust hole 102 is connected to an exhaust line 121. Reaction by-products produced during a process and gas residual in the chamber 100 may be exhausted through the exhaust line 121. The inner space 101 of the chamber 100 is decompressed by an exhausting process.

The substrate support assembly 200 is placed at an inside of the chamber 100. The substrate support assembly 200 supports the substrate W. The substrate support assembly 200 includes an electrostatic chuck for holding the substrate W by using electrostatic force. The substrate support assembly 200 includes a dielectric plate 210, a first electrode 220, a heater 230, a lower electrode 240 and an insulating plate 270.

The dielectric plate 210 is disposed on an upper end part of the substrate support assembly 200. The dielectric plate 210 is formed of a disc-shaped dielectric member. The substrate W is placed on the dielectric plate 210. Since a top surface of the dielectric plate 210 has a radius less than that of the substrate W, an edge area of the substrate W is placed outside the dielectric plate 210. A first supply passage 211 is formed in the dielectric plate 210. The first supply passage 211 extends from the top surface to the bottom surface of the dielectric plate 210. The first supply passage 211 includes a plurality of first supply passages 211 which are spaced apart from each other and serves as a passage through which a heat transfer medium is supplied to the bottom surface of the substrate W.

The first electrode 220 and the heater 230 are embedded in the dielectric plate 210. The first electrode 220 is placed over the heater 230. The first electrode 220 may be electrically connected to a first power source 220a. The first power source 220a may include a direct current power source. A switch 220b may be installed between the first electrode 220 and the first power source 220a. The first electrode 220 may be electrically connected to the first power source 220a through an ON/OFF operation of the switch 220b. When the first switch 220b is switched on, a direct current may be applied to the first electrode 220. Electrostatic force operates between the first electrode 220 and the substrate W due to the current applied to the first electrode 220, so that the substrate W may be attached to the dielectric plate 210 due to the electrostatic force.

A lower power supply unit 221 applies high-frequency power to the lower electrode 240. The lower power supply unit 221 includes a lower RF power supply 222 and 223 and a lower impedance matching unit 225. The lower RF power source 222 and 223 may include plural lower RF power sources 222 and 23 as shown in FIG. 1. Alternatively, the lower RF power source 222 and 223 may include a single RF power source. The lower RF power source 222 and 223 may control plasma density. The lower RF power source 222 and 223 may control ion bombardment energy. Each of the lower RF power sources 222 and 223 may generate a frequency power in the range of 2 MHz to 13.56 Hz. The lower impedance matching unit 225 is electrically connected to the lower RF power source 222 and 223. The lower impedance matching unit 225 allows mutually different frequency powers to be matched with each other and applies the matched frequency powers to the lower electrode 240.

The heater 230 is electrically connected to an external power source (not shown). The heater 230 generates heat based on the current applied from the external power source thereto. The generated heat is transferred to the substrate W through the dielectric plate 210. The substrate W is maintained at a predetermined temperature due to the heat generated by the heater 230. The heater 230 includes a spiral-shaped coil. The heater 230 may be embedded in the dielectric plate 210 by a uniform interval.

The lower electrode 240 is placed below the dielectric plate 210. The bottom surface of the dielectric plate 210 and the top surface of the lower electrode 240 may adhere to each other with adhesive 236. The lower electrode 240 may be formed of an aluminum material. A central area of the top surface of the lower electrode 240 may be placed at a position higher than that of an edge area of the top surface, so that a step difference is generated between the central area and the edge area. The central area of the top surface of the lower electrode 240 has an area corresponding that of the bottom surface of the dielectric plate 210 and is attached to the bottom surface of the dielectric plate 210. The lower electrode 240 includes first and second circulation passages 241 and 242 and a second supply passage 243.

The first circulation passage 241 serves as a passage through which the heat transfer medium is circulated. The first circulation passage 241 may be formed in a spiral shape in the lower electrode 240. In addition, the first circulation passage 241 may include ring-shaped passages which have mutually different radii and are concentrically disposed. The first circulation passages 241 may communicate with each other. The first circulation passages 241 have the same height.

The second circulation passage 242 serves as a passage through which coolant is circulated. The second circulation passage 242 may be formed in spiral shape in the lower electrode 240. In addition, the second circulation passage 242 may include ring-shaped passages which have mutually different radii and are concentrically disposed. The second circulation passages 242 may communicate with each other. The second circulation passage 242 may have an area larger than the first circulation passage 241. The second circulation passages 242 have the same height. The second circulation passage 242 may be placed under the first circulation passage 241.

The second supply passage 243 extends upwardly from the first circulation passage 241 to the top surface of the lower electrode 240. The number of second supply passages 243 corresponds to that of the first supply passage 211. The second supply passage 243 connects the first circulation passage 241 and the first supply passage 211 to each other.

The first circulation passage 241 is connected to a heat transfer medium storage unit 252 through a heat transfer medium supply line 251. The heat transfer medium storage unit 252 stores a heat transfer medium. The heat transfer medium includes inert gas. According to an embodiment, the heat transfer medium includes helium gas. The helium gas is supplied to the first circulation passage 241 through the heat transfer medium supply line 251 and then, is supplied to the bottom surface of the substrate W via the second supply passage 243 and the first supply passage 211 in sequence. The helium gas serves as the medium of transferring the heat transferred from the plasm to the substrate W to the substrate support assembly 200. The ion particles contained in plasma are transferred to the substrate support assembly 200 due to the electric force formed in the substrate support assembly 200 and collide with the substrate W while being transferred, so that an etching process is performed. When the ion particles collide with the substrate W, heat is generated from the substrate W. The heat generated from the substrate W is transferred to the substrate support assembly 200 by the helium gas supplied to the space between the bottom surface of the substrate W and the top surface of the dielectric plate 210. Thus, the substrate W may be maintained at a set temperature.

The second circulation passage 242 is connected to a coolant storage unit 262 through a coolant supply line 261. The coolant storage unit 262 stores coolant. A cooler 263 may be provided in the coolant storage unit 262. The cooler 263 cools the coolant to a predetermined temperature. To the contrary, the cooler 263 may be installed on the coolant supply line 261. The coolant supplied to the second circulation passage 242 through the coolant supply line 261 is circulated through the second circulation passage 242 to cool the lower electrode 240. While the lower electrode 240 is cooled, the substrate W is cooled together with the dielectric plate 210, so that the substrate W is maintained at a predetermined temperature.

The insulating plate 270 is provided below the lower electrode 240. The insulating plate 270 has a size corresponding to the lower electrode 240. The insulating plate 270 is placed between the lower electrode 240 and the bottom surface of the chamber 100. The insulating plate 270 is formed of an insulating material such that the lower electrode 240 is electrically insulated against the chamber 100.

A focus ring 280 is disposed on an edge are of the substrate support assembly 200. The focus ring 200 has a ring shape and disposed around the dielectric plate 210. A top surface of the focus ring 280 includes outer and inner parts 280a and 280b, where the outer part 280a is higher than the inner part 280b, so that a step difference is formed on the top surface of the focus ring 280. The inner part 280b of the top surface of the focus ring 280 is positioned at the same height as that of the top surface of the dielectric plate 210. The inner part 280b of the top surface of the focus ring 280 supports an edge area of the substrate W placed at an outside of the dielectric plate 210. The outer part 280a of the top surface of the focus ring 280 surrounds an edge area of the substrate W. The focus ring 280 expands an electric field forming area such that the substrate W is located at the center of an area in which plasma is formed. Thus, the plasma is uniformly formed in the entire area of the substrate W, so that each area of the substrate W may be uniformly etched.

The gas supply unit 300 supplies process gas to the chamber 100. The gas supply unit 300 includes a gas storage unit 310, a gas supply line 320 and a gas inflow port 330. The gas supply line 320 is connected to the gas storage unit 310 and the gas inflow port 330 and supplies the gas stored in the gas storage unit 310 to the gas inflow port 330. The gas inflow port 330 is connected to gas supply holes 412 formed on an upper electrode 410.

The plasma generation unit 400 excites the process gas remaining in the chamber 100. The plasma generation unit 400 includes the upper electrode 410, a distribution plate 420 and an upper power supply unit 440.

The upper electrode 410 has a disc shape and is placed above the substrate support assembly 200. The upper electrode 410 includes an upper plate 410a and a lower plate 410b. The upper plate 410a has a disc shape. The upper plate 410a is electrically connected to an upper RF power source 441. A first RF power generated from the upper RF power source 441 is applied to the process gas remaining in the chamber 100 through the upper plate 410a, such that the process gas is excited. The process gas is excited into a plasma state. A lower surface of the upper plate 410a includes a central area and an edge area, where the central area is placed higher than the edge area so that a step difference is generated between them. Gas supply holes 412 are formed on a central area of the upper plate 410a. The gas supply holes 412 are connected to the gas inflow port 330, through which gas is supplied to a buffer space 414. A cooling passage 411 may be formed in the upper plate 410a. The cooling passage 411 may be formed in a spiral shape. In addition, the cooling passage 411 may include ring-shaped passages which have mutually different radii and are concentrically disposed. The cooling passage 411 is connected to the coolant storage unit 432 through the coolant supply line 431. The coolant storage unit 432 stores coolant. The coolant stored in the coolant storage unit 432 is supplied to the cooling passage 411 through the coolant supply line 431. The coolant is circulated through the cooling passage 411 to cool the upper plate 410a.

The lower plate 410b is placed below the upper plate 410a. The lower plate 410b has a size corresponding to the upper plate 410a and faces the upper plate 410a. An upper surface of the lower plate 410b includes a central area and an edge area, where the central area is placed lower than the edge area so that a step difference is generated between them. The upper surface of the lower plate 410b and the lower surface of the upper plate 410a are combined with each other to form the buffer space 414. The buffer space 414 serves as a space in which the gas supplied through the gas supply holes 412 temporarily remains before the gas is supplied to the chamber 100. Gas supply holes 413 are formed on the central area of the lower plate 410b. The gas supply holes 413 are spaced apart from each other by a predetermined interval. The gas supply holes 413 are connected to the buffer space 414.

The distribution plate 420 is placed below the lower plate 410b. The distribution plate 420 has a disc shape. Distribution holes 421 are formed on the distribution plate 420. The distribution holes 421 are formed from the upper surface of the distribution plate 420 to the lower surface of the distribution plate 420. The number of the distribution holes 421 corresponds to that of the gas supply holes 413 and the distribution holes 421 are located corresponding to the gas supply holes 413. The process gas remaining in the buffer space 414 is uniformly supplied to the chamber 100 through the gas supply holes 413 and the distribution holes 421.

The upper power supply unit 440 applies high-frequency (RF) power to the upper plate 410a. The upper power supply unit 440 may include an upper RF power source 441 and an upper impedance matching unit 442. The upper RF power source 441 may generate frequency power of 100 MHz.

The pulse input unit 7 may apply an ON/OFF pulse to the power supply units 221 and 440. The pulsed high-frequency power may be generated from the upper and lower RF power sources 441, 222 and 223 according to the ON/OFF pulse applied by the pulse input unit 700.

The attenuation module 1100 may attenuate the pulsed high-frequency power signals generated from the power supply units 221 and 440. As shown, in order to sense the pulsed RF power signals having mutually different frequencies, which are applied from the RF power sources 222, 223, and 441, the attenuation module 1110 may include first to third attenuation modules 1110, 1130 and 1150 corresponding to the RF power sources, respectively. As one example, the attenuation modules may be disposed between the RF power sources and the impedance matching units, respectively, but the embodiment is not limited thereto. The attenuation modules may be disposed between the impedance matching units 225 and 442 and the chamber 100, respectively.

The monitoring apparatus 1000 may detect a pulse parameter by using the pulsed high-frequency power signal applied from the RF power source 222, 223 and 441 to the chamber 100 to monitor the pulsed high-frequency power. Hereinafter, the apparatus for monitoring pulsed high-frequency power will be described in detail with reference to FIG. 3.

Figure 2:
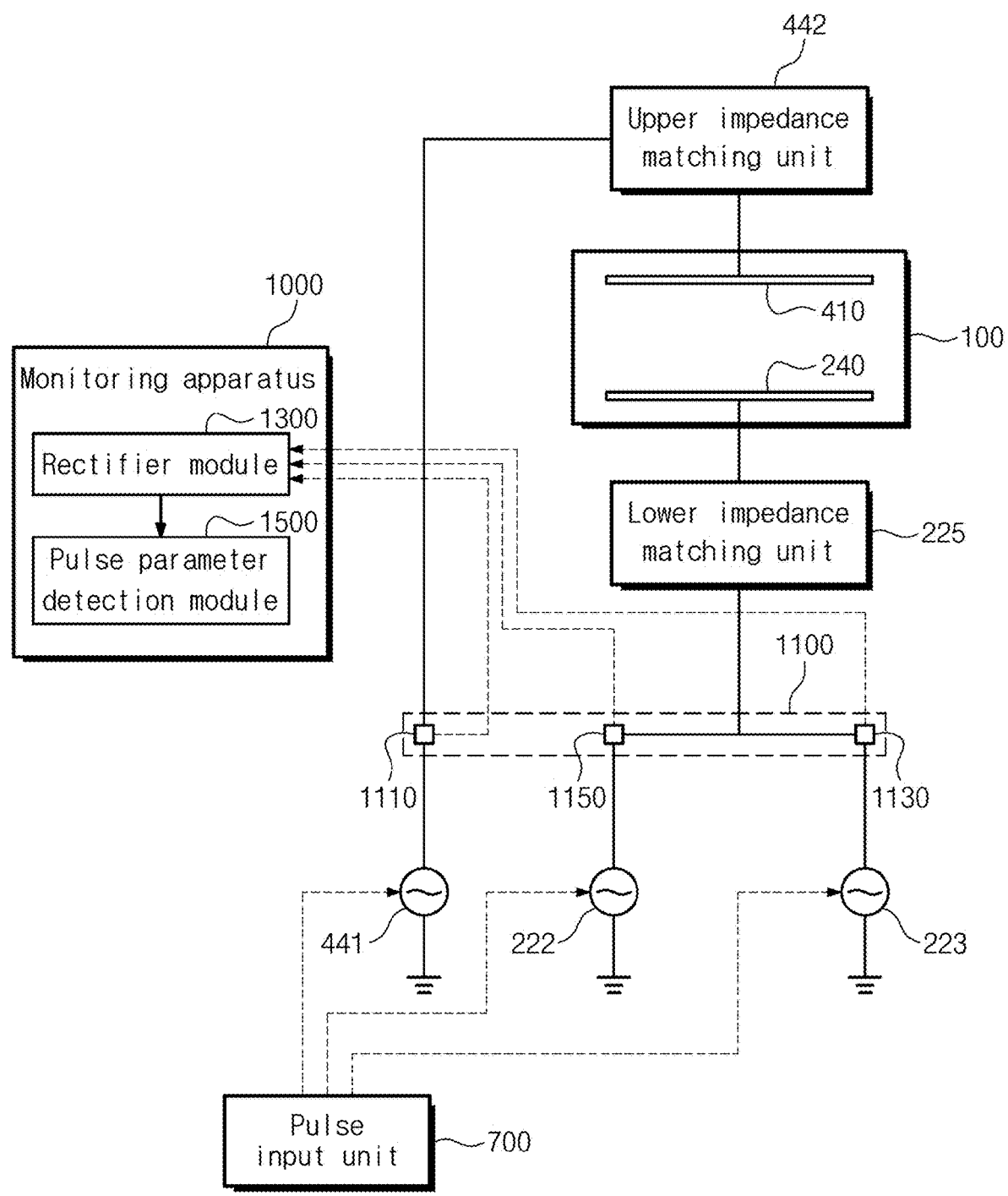
FIG. 2 is a schematic view illustrating interworking between elements of a substrate processing apparatus including an apparatus for monitoring pulsed high-frequency power according to an embodiment.

FIG. 2 is a schematic view illustrating interworking between elements of a substrate processing apparatus including an apparatus for monitoring pulsed high-frequency power according to an embodiment.

An apparatus for processing a substrate according to an embodiment may include a high-frequency (RF) power source 222, 223 and 441 configured to provide at least one high-frequency power, a pulse input unit 700 configured to apply an ON/OFF pulse to the high-frequency power source to pulse the high-frequency power, a chamber 100 including a plasma source configured to generate plasma by using the pulsed high-frequency power, an impedance matching unit 442 and 225 connected between the high-frequency power source and the chamber 100 to perform impedance matching, an attenuation module 1100 disposed on the outside of the chamber to attenuate a pulsed high-frequency power signal which is applied to the chamber, a rectifier module 1300 configured to convert a high-frequency power signal attenuated by the attenuation module 1100 into a direct current signal, and a detection module 1500 configured to detect a pulse parameter from the direct current signal.

As shown in FIG. 2, the pulse input unit 700 may apply the ON/OFF pulse to the upper and lower RF power sources 222 and 223. Thus, the upper and lower RF power sources 222 and 223 generate pulsed high-frequency power. The attenuation module 1100 may attenuate the pulsed high-frequency power signal generated from each RF power source and may transfer the attenuated high-frequency power signal to the rectifier module 1300 of the monitoring apparatus 1000. The rectifier module 1300 converts the received high-frequency power signal into a direct current signal. The detection module 1500 may detect the pulse parameter from the direct current signal such that the pulsed high-frequency power signal is easily monitored. For example, the pulse parameter may include at least one among the pulse frequency, the pulse duty ratio and the pulse phase.

Figure 3:
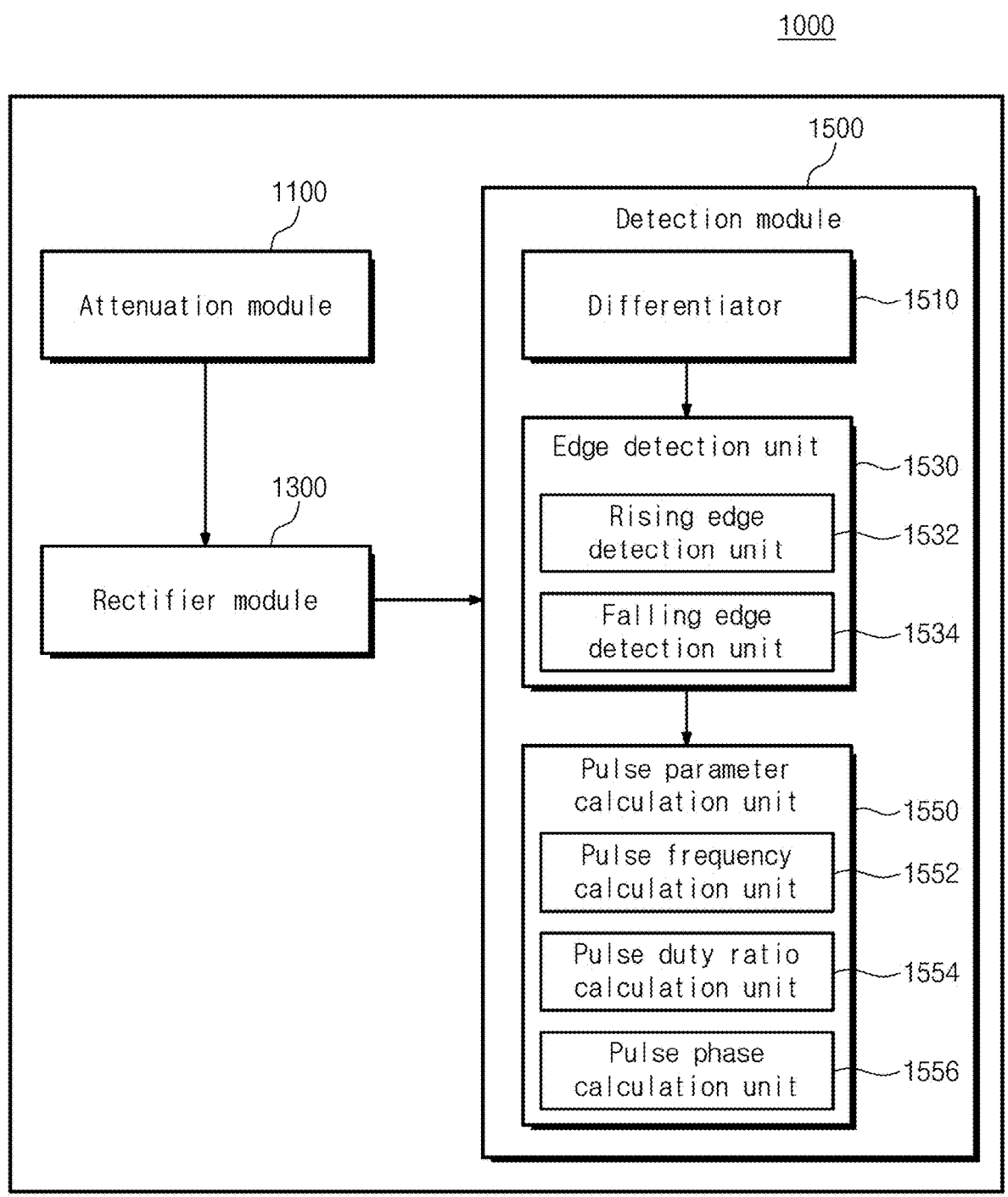
FIG. 3 is a block diagram illustrating an apparatus for monitoring pulsed high-frequency power according to an embodiment.

FIG. 3 is a block diagram illustrating an apparatus 1000 for monitoring pulsed high-frequency power according to an embodiment.

As shown in FIG. 3, an apparatus 1000 for monitoring pulsed high-frequency power according to an embodiment may include an attenuation module 1100, a rectifier module 1300 and a detection module 1500.

The attenuation module 1100 may attenuate the pulsed high-frequency power signal applied from a power source and transfer it to the rectifier module 1300. For example, the attenuation module 1100 may include a waveguide attenuator which senses the pulsed high-frequency power signal applied from the power source, attenuates the sensed signal, and transfers it to a rectifier module, but the embodiment is not limited thereto. As one example, the high-frequency power signal may be attenuated to be in the range of 0 V to 10 V.

The rectifier module 1300 may convert the high-frequency power signal attenuated by the attenuation module 1100 into the direct current signal. That is, the direct current signal may be generated by rectifying the attenuated high-frequency power signal which is an AC signal.

The detection module 1500 may detect the pulse parameter from the direct current signal obtained through the rectifier module 1300. For example, the detection module may include differentiator 1510 configured to differentiate the direct current signal, an edge detection unit 1530 configured to detect an edge of the direct current signal based on a differentiation value obtained by differentiating the direct current signal through the differentiator 1510, and a pulse parameter calculation unit 1550 configured to calculate a pulse parameter based on the detected edge signal detected by the edge detection unit 1530, wherein the pulse parameter includes at least one of a pulse frequency, a pulse duty ratio and a pulse phase.

The differentiator 1510 may include a differentiation circuit in which a capacitor and a resistor are connected in series to each other and a voltage of the resistor is output as the output signal, but the embodiment is not limited thereto. As one embodiment, an arbitrary positive value of the pulse-type direct current signal when the pulse-type direct current signal is changed from an OFF region to an ON region and an arbitrary negative value of the pulse-type direct current signal when the pulse-type direct current signal is changed from an OFF region to an ON region may be output as the output signal output by the differentiator, where the OFF and ON regions constitute a period of the pulse-type direct current signal.

The edge detection unit 1530 may detect an edge of the direct current signal based on the differentiation value output from the differentiator 1510. As one embodiment, the edge detection unit may include a rising edge detection unit 1532 configured to detect a rising edge of the direct current signal, and a falling edge detection unit 1534 configured to detect a falling edge of the direct current signal. As one embodiment, the rising edge detection unit 1532 may detect an arbitrary positive value output from the differentiator 1510 and the falling edge detection unit 1534 may detect an arbitrary negative value output from the differentiator 1510.

The pulse parameter calculation unit 1550 may include a pulse frequency calculation unit 1552 configured to calculate a pulse frequency of the direct current signal, a pulse duty ratio calculation unit 1554 configured to confirm a ratio of an ON time of the direct current signal, and a pulse phase calculation unit 1556.

The pulse frequency calculation unit 1552 may calculate the pulse frequency of the direction current signal based on at least two continuous rising edge signals detected by the rising edge detection unit 1532. Alternatively, the pulse frequency calculation unit 1552 may calculate the pulse frequency of the direction current signal based on at least two continuous falling edge signals detected by the falling edge detection unit 1534. As one embodiment, the rising edge signal may be an arbitrary positive value detected by the rising edge detection unit. For example, the pulse frequency may be calculated based on a period of arbitrary positive values sequentially detected by the rising edge detection unit.

The pulse duty ratio calculation unit 1554 may calculate a pulse duty ratio of the direct current signal based on the rising and falling edge signals sequentially detected by the rising and falling edge detection units 1532 and 1534. As one embodiment, the arbitrary positive and negative values may be sequentially detected by the rising and falling edge detection units 1532 and 1534 to calculate the pulse duty ratio of the direct current signal based on the difference between the time points at which the positive and negative values are detected.

When the direct current signals are applied to the detection module, the pulse phase calculation unit 1556 may calculate the phase by comparing the detected edge signals by the edge detection unit 1530 with each other. As one embodiment, as shown in FIGS. 1 and 2, when the high-frequency powers having mutually different frequencies are applied, the detection module including a storage unit may store edge signals of the high-frequency power having mutually different frequencies. Thus, a phase of each signal may be calculated by setting an arbitrary reference phase for signals having mutually different frequencies and comparing the edge signals of high-frequency power with each other.

Figure 4:
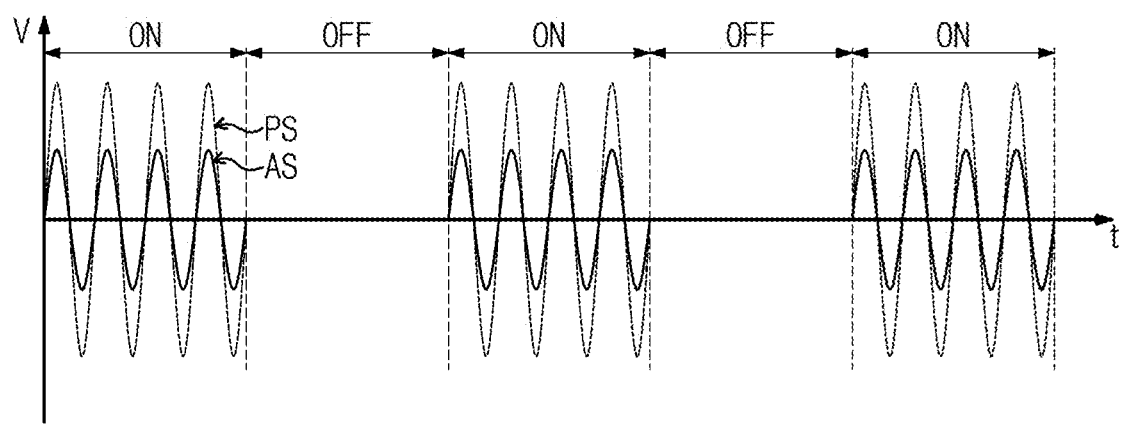
FIG. 4 is a waveform diagram illustrating a high-frequency power signal attenuated by an attenuation module according to an embodiment.

FIG. 4 is a waveform diagram illustrating a high-frequency power signal attenuated by an attenuation module 1100 according to an embodiment.

As shown in FIG. 4, the attenuation module 1100 according to an embodiment may attenuate a pulsed high-frequency power signal PS having an ON/OFF region to generate an attenuation signal AS in a narrower voltage range. As one embodiment, the voltage range may include a range of 0 V to 10 V, but the embodiment is not limited thereto.

Figure 5:
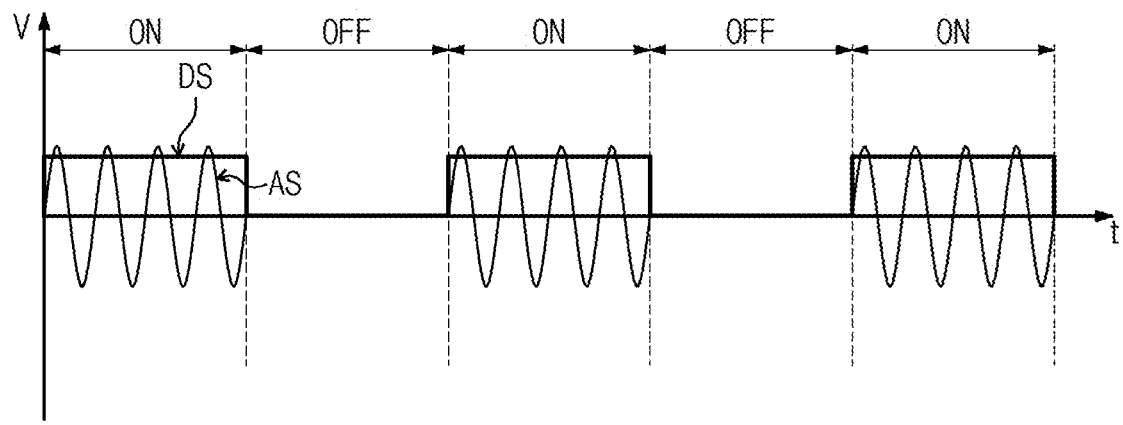
FIG. 5 is a waveform diagram illustrating a direct current (DC) signal rectified by a rectifier module according to an embodiment.

FIG. 5 is a waveform diagram illustrating a direct current signal DS rectified by the rectifier module 1300 according to an embodiment.

As shown in FIG. 5, the rectifier module 1300 according to an embodiment may convert the attenuation signal AS of FIG. 4 into a direct current signal DS. Thus, the direct current signal DS may become a pulse type direct current having ON and OFF regions constituting the period thereof.

Figure 6:
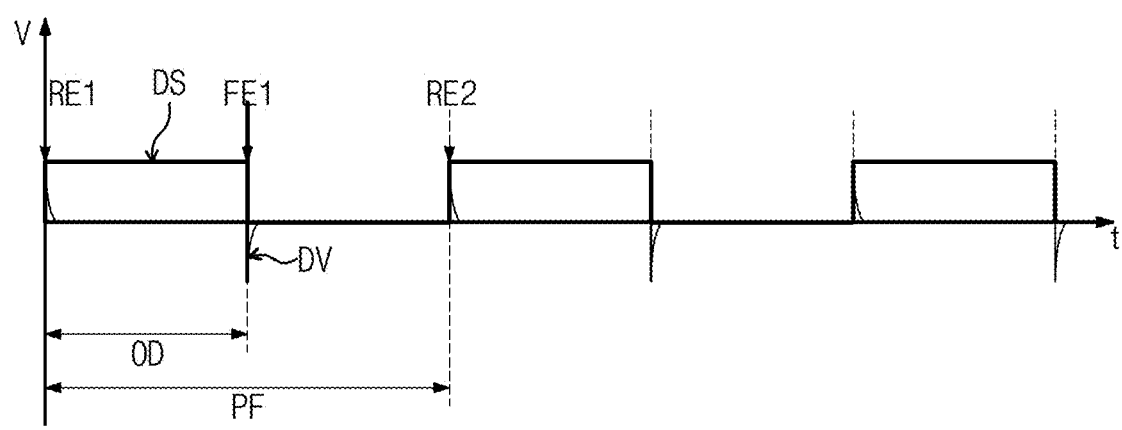
FIG. 6 is a view illustrating a method of calculating a pulse parameter by a detection module according to an embodiment.

FIG. 6 is a view illustrating a method of calculating a pulse parameter by the detection module 1500 according to an embodiment.

As shown in FIG. 6, the detection module 1500 according to an embodiment may detect an edge signal based on a differentiation value DV obtained by differentiating the direct current signal DS from the rectifier module 1300. As shown in FIG. 6, a positive value is output at the rising edge RE1 of the pulse of the direct current signal DS and a negative value is output at the falling edge FE1 of the pulse of the direct current signal DS.

Thus, to calculate the pulse frequency PF of the direct current signal, a difference between continuous rising edge signals, for example, the time points of rising edges 1 and 2 RE1 and RE2 may be used.

In addition, when a pulse duty ratio OD of the direct current signal, that is, a ratio of the ON region in the direct current signal is calculated, a time (FE1-RE1) of the ON region may be obtained by calculating a difference between sequentially detected rising and falling edge signals, for example, the time points of rising edge 1 RE1 and a falling edge 1 FE1 such that the pulse duty ratio is calculated by (FE1-RE1)/(RE2-RE1).

In addition, when a plurality of direct current signals are applied to the detection module and a phase reference signal is set, the phase of each direct current may be calculated by comparing the rising or falling edge signal RE1 or FE1 corresponding to the current signal with the phase reference signal.

Figure 7:
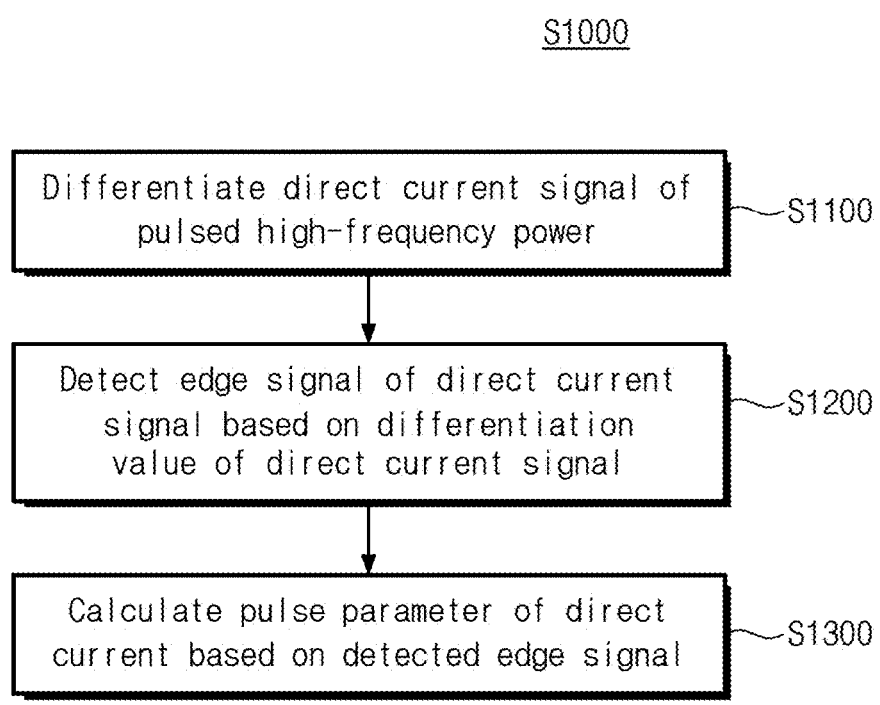
FIG. 7 is a flowchart illustrating a method of monitoring pulsed high-frequency power according to an embodiment.

FIG. 7 is a flowchart illustrating a method S1000 of monitoring pulsed high-frequency power according to an embodiment.

As shown in FIG. 7, a method of monitoring pulsed high-frequency power according to an embodiment may include differentiating a direct current signal of the pulsed high-frequency power (S1100), detecting an edge signal of the direct current signal of the pulsed high-frequency power based on a differentiation value of the differentiated direct current signal (S1200), and calculating a pulse parameter of the direct current of the pulsed high-frequency power based on the detected edge signal (S1300).

The detecting (S1200) may include detecting a rising edge signal of the direct current signal of the pulsed high-frequency power based on the differentiation value of the direct current signal, and detecting a falling edge signal of the direct current signal of the pulsed high-frequency power. As one embodiment, the detecting of the rising edge signal may include detecting an arbitrary positive value of the differentiation value of the direct current signal, and the detecting of the falling edge signal may include detecting an arbitrary negative value of the differentiation value of the direct current signal.

The calculating (S1300) may include calculating a pulse frequency of the direct current signal based on at least two continuous rising edge signals of the rising edge signals; calculating a pulse duty ratio of the direct current signal based on the rising and falling edge signals sequentially detected; and, when the direct current signal of the pulsed high-frequency power includes a plurality of direct current signals, calculating a pulse phase by comparing edge signals of the current signals with one another.

The method for monitoring pulsed high-frequency power described above may be implemented in a program executable through a computer as an application and may be recorded on a computer-readable recording medium. The computer-readable recording medium may include a volatile memory such as a static RAM (SRAM), a dynamic RAM (DRAM), a synchronous DRAM (SDRAM), etc., a non-volatile memory such as a read only memory (ROM), a programmable ROM (PROM), an electrically erasable and programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), etc., a floppy disk, a hard disk, or an optical recording media such as a storage medium including a compact disc read only memory (CD-ROM), a digital versatile disc (DVD), etc., but the embodiment is not limited thereto.

According to the inventive concept, the pulsed high-frequency power signal can be easily monitored in real time.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
   a chamber;
   a substrate support assembly within the chamber, the substrate support assembly including a lower electrode;
   a lower impedance matching unit connected to the lower electrode;
   a first RF power source connected to the lower impedance matching unit, the first RF power source configured to generate a first pulsed power signal according to a first ON/OFF pulse;
   a second RF power source connected to the lower impedance matching unit, the second RF power source configured to generate a second pulsed power signal according to a second ON/OFF pulse;
   a pulse input unit configured to apply the first ON/OFF pulse to the first RF power source and apply the second ON/OFF pulse to the second RF power source; and
   a monitoring unit including
      a rectifier module configured to convert the first pulsed power signal into a first direct current signal and convert the second pulsed power signal into a second direct current signal, and
      a detection module configured to detect a first pulse parameter including at least one of a pulse frequency of the first direct current signal, a pulse duty ratio of the first direct current signal, and a pulse phase difference of the first direct current signal and the second direct current signal.

2. The apparatus of claim 1, wherein the monitoring unit further includes an attenuation module configured to attenuate the first pulsed power signal and attenuate the second pulsed power signal, and
wherein the rectifier module is further configured to convert an attenuated first power signal into the first direct current signal and convert an attenuated second power signal into the second direct current signal.

3. The apparatus of claim 2, wherein the attenuation module attenuates the first pulsed power signal such that the first pulsed power signal is in a range of 0 V to 10 V.

4. The apparatus of claim 1, wherein the detection module includes:
a differentiator configured to differentiate the first direct current signal; and
an edge detection unit configured to detect an edge of the first direct current signal based on a differentiation value obtained by differentiating the first direct current signal through the differentiator.

5. The apparatus of claim 4, wherein the edge detection unit includes:
a rising edge detection unit configured to detect a rising edge of the first direct current signal; and
a falling edge detection unit configured to detect a falling edge of the first direct current signal.

6. The apparatus of claim 5, wherein the detection module further includes a pulse frequency calculation unit configured to calculate the pulse frequency of the first direct current signal based on at least two continuous rising edge signals detected by the rising edge detection unit.

7. The apparatus of claim 5, wherein the detection module further includes a pulse duty ratio calculation unit configured to calculate the pulse duty ratio of the first direct current signal based on the rising edge and the falling edge of the first direct current signal sequentially detected, respectively, by the rising edge detection unit and the falling edge detection unit.

8. The apparatus of claim 4, wherein the detection module further includes a pulse phase calculation unit configured to calculate the pulse phase difference of the first direct current signal by comparing a first edge signal of the first direct current signal detected by the edge detection unit with a second edge signal of the second direct current signal detected by the edge detection unit.

9. The apparatus of claim 1, wherein the detection module is further configured to detect a second pulse parameter including at least one of a pulse frequency of the second direct current signal, a pulse duty ratio of the second direct current signal, and a pulse phase difference between the second direct current signal and the first direct current signal.

10. The apparatus of claim 1, wherein the lower impedance matching unit is configured to perform impedance matching between the chamber, and the first RF and the second RF power sources.

11. The apparatus of claim 1, further comprising:
an upper impedance matching unit connected to an upper electrode of the chamber; and
a third RF power source connected to the upper impedance matching unit, the third RF power source configured to generate a third pulsed power signal according to a third ON/OFF pulse, and
wherein the pulse input unit is further configured to apply the third ON/OFF pulse to the third RF power source.

12. The apparatus of claim 11, wherein the rectifier module is further configured to convert the third pulsed power signal into a third direct current signal, and
wherein the detection module is further configured to detect a third pulse parameter including at least one of a pulse frequency of the third direct current signal, a pulse duty ratio of the third direct current signal, and a pulse phase difference between the third direct current signal, and the first and the second direct current signals.

13. An apparatus for processing a substrate, the apparatus comprising:
a chamber including an upper electrode and a lower electrode;
a pulse input unit configured to generate a plurality of ON/OFF pulses;
a plurality of RF power sources configured to generate a plurality of pulsed power signals according to the plurality of ON/OFF pulses for applying the plurality of pulsed power signals to at least one of the upper electrode and the lower electrode; and
a monitoring unit including
a rectifier module configured to convert the plurality of pulsed power signals into a plurality of direct current signals, and
a detection module configured to detect a pulse parameter including at least one of a pulse frequency of one of the plurality of direct current signals, a pulse duty ratio of the one of the plurality of direct current signals, and a pulse phase difference between the plurality of direct current signals.

14. The apparatus of claim 13, wherein the monitoring unit further includes a plurality of attenuation modules configured to attenuate the plurality of pulsed power signals, and
wherein the rectifier module is further configured to convert a plurality of attenuated power signals into the plurality of direct current signals.

15. The apparatus of claim 14, wherein the detection module includes:
a differentiator configured to differentiate the one of the plurality of direct current signals; and
an edge detection unit configured to detect an edge of the one of the plurality of direct current signals based on a differentiation value obtained by differentiating the one of the plurality of direct current signals through the differentiator.

16. The apparatus of claim 15, wherein the edge detection unit includes:
a rising edge detection unit configured to detect a rising edge of the one of the plurality of direct current signals; and
a falling edge detection unit configured to detect a falling edge of the one of the plurality of direct current signals.

17. The apparatus of claim 16, wherein the detection module further includes a pulse frequency calculation unit configured to calculate the pulse frequency of the one of the plurality of direct current signals based on at least two continuous rising edge signals detected by the rising edge detection unit.

18. The apparatus of claim 16, wherein the detection module further includes a pulse duty ratio calculation unit configured to calculate the pulse duty ratio of the one of the plurality of direct current signals based on the rising edge and the falling edge of the one of the plurality of direct current signals sequentially detected, respectively, by the rising edge detection unit and the falling edge detection unit.

19. The apparatus of claim 15, wherein the detection module further includes a pulse phase calculation unit configured to calculate the pulse phase difference of the one of the plurality of direct current signals by comparing a plurality of edge signals of the plurality of direct current signals detected by the edge detection unit.

20. An apparatus for monitoring a plurality of pulsed power signals, the apparatus comprising:
- a rectifier module configured to convert the plurality of pulsed power signals into a plurality of direct current signals; and
- a detection module configured to detect a pulse parameter including at least one of a pulse frequency of one of the plurality of direct current signals, a pulse duty ratio of the one of the plurality of direct current signals, and a pulse phase difference between the plurality of direct current signals.

* * * * *